US008606427B2

(12) United States Patent
Chan et al.

(10) Patent No.: US 8,606,427 B2
(45) Date of Patent: Dec. 10, 2013

(54) CONTAINER DATA CENTER AND HEAT DISSIPATION SYSTEM THEREOF

(75) Inventors: Hung-Chou Chan, Taipei Hsien (TW); Chun-Ming Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 388 days.

(21) Appl. No.: 12/965,834

(22) Filed: Dec. 11, 2010

(65) Prior Publication Data

US 2012/0109405 A1 May 3, 2012

(30) Foreign Application Priority Data

Oct. 29, 2010 (TW) .................................... 99137117

(51) Int. Cl.
*G05D 23/00* (2006.01)
(52) U.S. Cl.
USPC ........................................................ 700/300
(58) Field of Classification Search
USPC .......................................... 700/300; 165/287
See application file for complete search history.

(56) References Cited

U.S. PATENT DOCUMENTS

| | | | | |
|---|---|---|---|---|
| 6,283,380 | B1* | 9/2001 | Nakanishi et al. | 236/49.3 |
| 6,901,303 | B2* | 5/2005 | Larson et al. | 700/108 |
| 2008/0098763 | A1* | 5/2008 | Yamaoka | 62/259.2 |
| 2010/0317278 | A1* | 12/2010 | Novick | 454/184 |
| 2010/0321874 | A1* | 12/2010 | Bhattacharyya et al. | 361/679.5 |
| 2011/0054705 | A1* | 3/2011 | Vaidyanathan et al. | 700/282 |
| 2012/0118555 | A1* | 5/2012 | Tan | 165/287 |
| 2013/0047650 | A1* | 2/2013 | Moss | 62/186 |

* cited by examiner

*Primary Examiner* — Mohammad Ali
*Assistant Examiner* — Sivalingam Sivanesan
(74) *Attorney, Agent, or Firm* — Altis Law Group, Inc.

(57) ABSTRACT

A data center includes a container with a raised floor defining a number of openings, and a server system received in the container. The server system includes a rack and a number of servers received in the rack at different heights. Cooling air is released by a cooling device. A number of pressurizing fans are arranged under the raised floor aligned with the openings to drive the cooling air to flow upwards through the openings. A number of temperature sensors are mounted to the rack to sense temperatures of air flowing out of the servers. The temperatures sensed by the temperature sensors are transmitted to a computing unit. According to the temperatures, the computing unit adjusts the speeds of the pressurizing fans to make the cooling air within the container be better distributed for evenly cooling the servers.

7 Claims, 3 Drawing Sheets

CONTAINER DATA CENTER AND HEAT DISSIPATION SYSTEM THEREOF

BACKGROUND

1. Technical Field

The present disclosure relates to device cooling, and particularly to a container data center and a heat dissipation system of the container data center.

2. Description of Related Art

Data centers are centralized computing facilities that include many servers, often arranged on server racks or shelves, with one rack or shelf of servers considered a server system. The server systems are contained in a container. In a working state, the server systems generate heat in the data center. Therefore effectively dissipating heat from the container is necessary.

Data centers often include a raised floor to support the server systems. The raised floor defines a plurality of openings. Cooling air pipes are arranged under the raised floor. Cooling air released from the pipes flow upwards though the openings of the raised floor to cool the server systems. Because the cooling air comes from below, the servers arranged at lower levels tend to receive more cooling air than the servers at higher levels, which is not ideal for effective heat dissipation.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
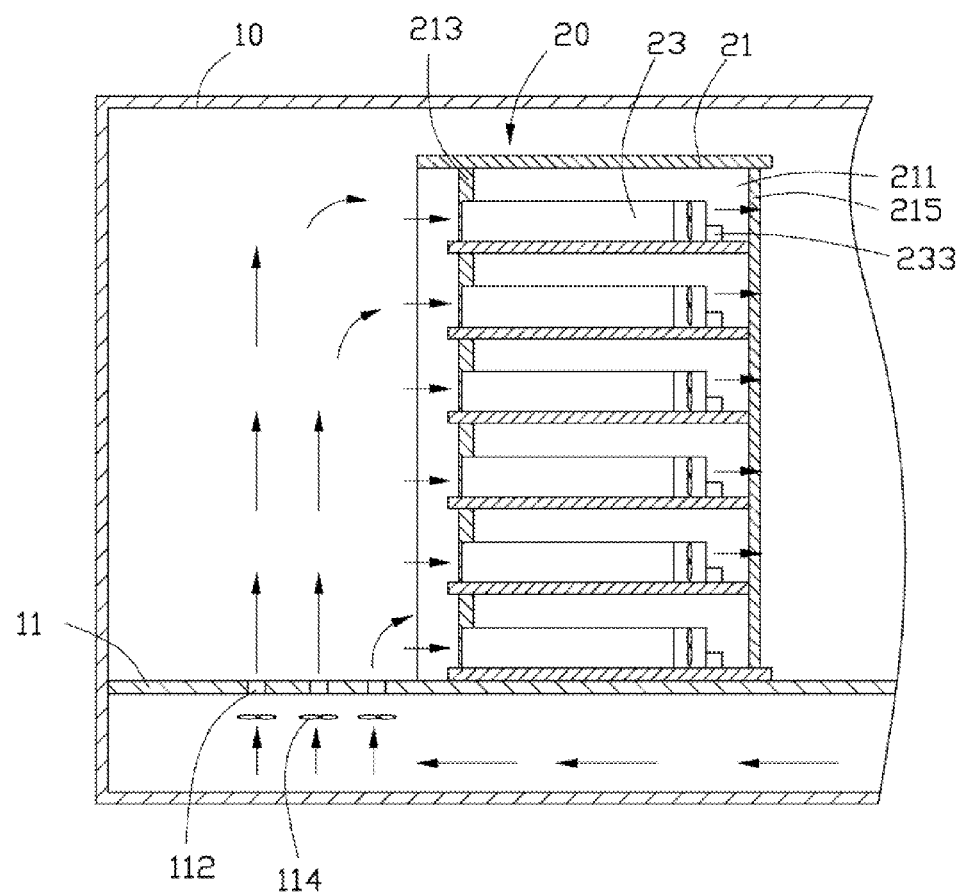
FIG. 1 is a sketch view of an embodiment of a container data center.

Referring to FIG. 1, an exemplary embodiment of a container data center includes a portable container 10, a plurality of server systems 20 (only one server system shown in FIG. 1) arranged in the container 10. The container 10 includes a raised floor 11 defining a plurality of openings 112. A plurality of pressurizing fans 114 is arranged under the raised floor 11 and respectively aligned with the openings 12 of the raised floor 11. In one embodiment, the number of the openings 112 is three, and the number of the fans 114 is three.

Each of the server systems 20 includes a rack 21 defining a plurality of accommodating spaces 211 at different heights, and a plurality of servers 23 respectively received in the accommodating spaces 211. Air flows into the servers 23 from a front end of the rack 21, and is dissipated from a rear end of the rack 21. A partitioning plate 213 and an anti-reflux gate 215 are arranged in each of the accommodating spaces 211, and are situated correspondingly adjacent the front and rear ends of the rack 21 to prevent heated air from flowing back into the servers 23. A plurality of temperature sensors 233 is mounted to the rear end of the rack 21 to sense temperatures of the air flowing out of the corresponding servers 23.

Figure 2:
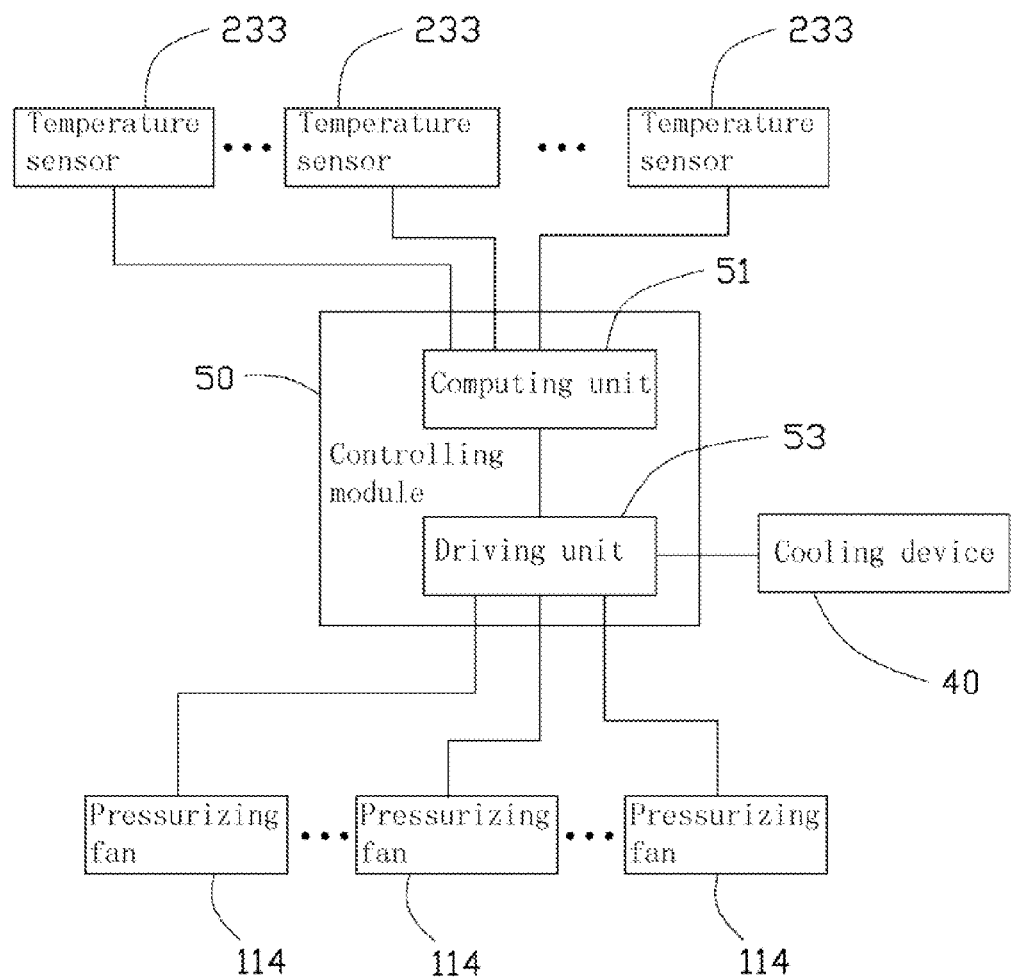
FIG. 2 is a block diagram of a first embodiment of a heat dissipation system of the container data center of FIG. 1.

Referring to FIG. 2, a first exemplary embodiment of a heat dissipation system of the container data center includes the pressurizing fans 114, the temperature sensors 233, a cooling device 40, and a controlling module 50. The cooling device 40 releases cooling air into the container 10 from a bottom of the container 10. The cooling air is driven to flow upwards through the opening 112 by the pressurizing fans 114. The fans 114 can be set at different speeds, some low to provide cooling air to lower servers 23, some at medium speeds to provide cooling air to servers 23 at medium height, and high speeds to provide cooling air to the highest positioned servers 23 so that the cooling air can be evenly distributed throughout the container 10 thereby more efficiently cooling all the servers 23 regardless of their height in the server systems 20.

The controlling module 50 includes a computing unit 51 and a driving unit 53. The pressurizing fans 114, and the cooling device 40 are electrically connected to the driving unit 53. The temperature sensors 233 are electrically connected to the computing unit 51. Temperatures sensed by the temperature sensors 233 are transmitted to the computing unit 51 and are compared with one other by the computing unit 51. If a temperature corresponding to a server 23 arranged at a high position is higher than a temperature corresponding to a server 23 arranged at a low position, the computing unit 51 sends a controlling signal to the driving unit 53 to adjust the speeds of the pressurizing fans 114. In other words, the pressurizing fan 114 farthest away from the server system 23 is accelerated, but the closer pressurizing fans 114 may be decelerated. Therefore, more cooling air is available for the server 23 arranged at the higher level, and the servers 23 arranged at the different height levels can be cooled evenly, the server 23 at the level with a higher temperature obtaining more cooling air, and the server 23 at the level with a lower temperature obtaining less cooling air.

Figure 3:
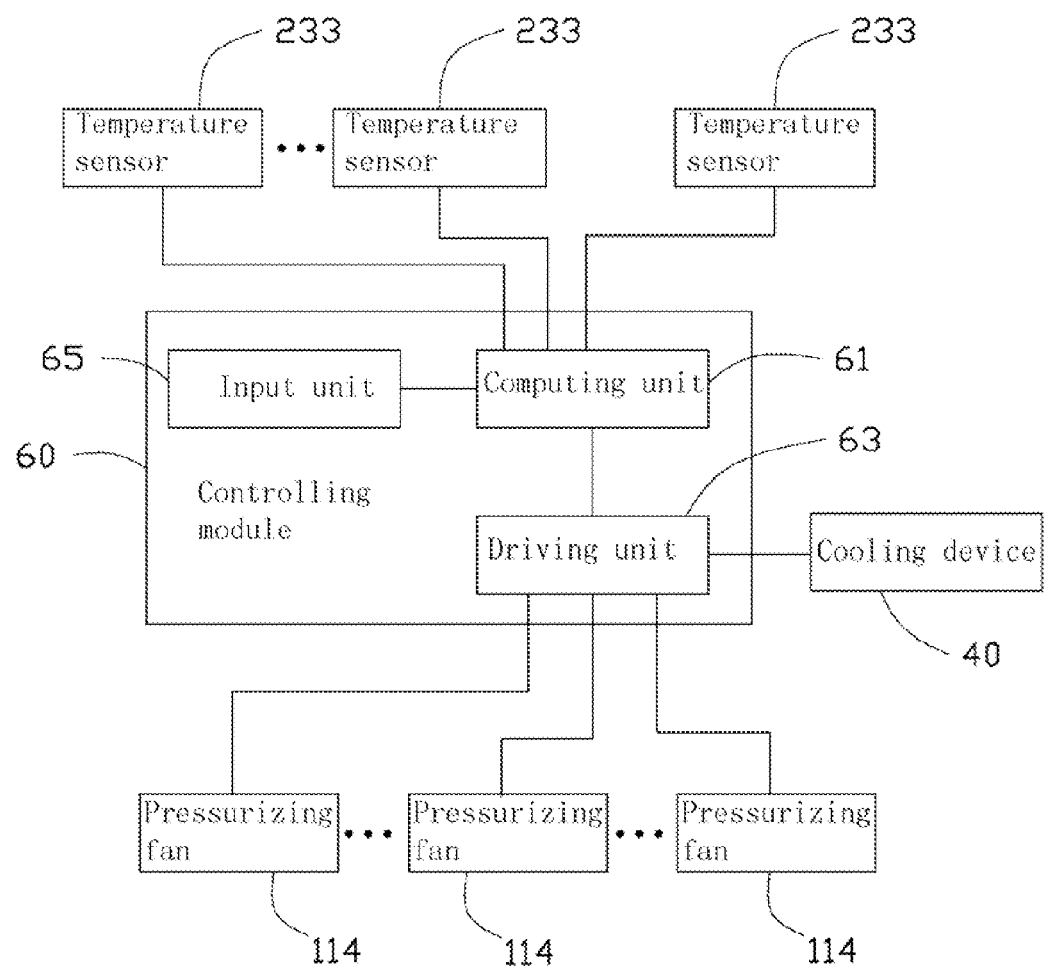
FIG. 3 is a block diagram of a second embodiment of a heat dissipation system of the container data center of FIG. 1.

Referring to FIG. 3, a second exemplary embodiment of a heat dissipation system of the container data center includes the pressurizing fans 114, the temperature sensors 233, a cooling device 40, and a controlling module 60. The controlling module 60 includes a computing unit 61, a driving unit 63, and an input unit 65 electrically connected to the computing unit 61. The pressurizing fans 114 and the cooling device 40 are electrically connected to the driving unit 63. A temperature range is input into the input unit 65. A maximum value of the temperature range reflects a highest allowed temperature of the dissipated air of the servers 23. The minimum value of the temperature range is a reasonable temperature of the dissipated air of the servers 23. If the temperature of the dissipated air of one of the servers 23 is lower than the minimum value, the cooling air flowing into the server 23 is more than needed. Temperatures sensed by the temperature sensors 233 are transmitted to the computing unit 61 and are respectively compared with the temperature range input into the inputted unit 65. When the temperature of the server 23 arranged at a high level is higher than the maximum value of the temperature range, but the temperature of the server 23 arranged at a low level is lower than the minimum value of the temperature range, the computing unit 61 sends a controlling signal to the driving unit 63 to adjust the speeds of the pressurizing fans 114, to increase the cooling air available for the server 23 at high position, and decrease the cooling air available for the server 23 at low position. Therefore, the temperatures are changed to be within the temperature range. When all of the temperatures are higher than the maximum value of the temperature range, or are lower than the minimum value of the temperature range, the computing unit 61 sends a controlling signal to the driving unit 63 to correspondingly accelerate or decelerate all of the pressurizing fans 114.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A data center comprising:
    a container comprising a raised floor defining a plurality of openings;
    at least one server system received in the container and supported on the raised floor,
    the server system comprising a rack and a plurality of servers received in the rack, arranged at different height levels;
    a plurality of pressurizing fans arranged under the raised floor and correspondingly aligned with the openings;
    a cooling device to release cooling air into the container under the raised floor, the pressurizing fans driving the cooling air to flow upwards through the openings to cooling the servers;
    a plurality of temperature sensors mounted to the rack to sense the temperatures of dissipated air of the servers; and
    a controlling module electrically connected to the pressurizing fans and the temperature sensors;
    wherein the controlling module differentially adjusts the speeds of the pressurizing fans according to the temperature sensed by the temperature sensors, to make the server at a level with a higher temperature obtain more cooling air, and the server at a level with a lower temperature obtain less cooling air, and
    wherein distances between the pressurizing fans and the server system are different from one another, the speeds of the pressurizing fans are adjusted to be different from one another, and increased with the increasing distances between the respective pressurizing fans and the server system to make the cooling air be evenly distributed in the container.

2. The data center of claim 1, wherein the container is portable.

3. The data center of claim 1, wherein the rack of the server system defines a plurality of accommodating spaces at different height levels, respectively receiving the servers, a partitioning plate and an anti-reflux gate are correspondingly arranged at opposite ends of each of the accommodating spaces to prevent heated air dissipated from the servers from flowing back into the servers.

4. A heat dissipation system to cool a data center, the data center comprising a container and a plurality of server arranged in the container at different height levels, the heat dissipation system comprising:
    a cooling device to release cooling air into the container from a bottom of the container;
    a plurality of temperature sensors to sense the temperatures of dissipated air of the servers;
    a plurality of pressurizing fans mounted in the container adjacent to the bottom of the container to drive the cooling air to flow upwards to cooling the servers; and
    a controlling module electrically connected to the pressurizing fans and the temperature sensors; and
    a container containing the above elements and comprising a raised floor defining a plurality of openings;
    wherein the controlling module differentially adjusts the speeds of the pressurizing fans according to the temperature sensed by the temperature sensors, to make the server at a level with a higher temperature obtain more cooling air, and the server at a level with a lower temperature obtain less cooling air, and
    wherein distances between the pressurizing fans and the servers are different from one another, the speeds of the pressurizing fans are adjusted to be increased with the increasing distances between the respective pressurizing fans and the servers to make the cooling air be evenly distributed in container.

5. The heat dissipation system of claim 4, wherein the servers are arranged in a rack, the pressurizing fans are arranged under the raised floor and aligned with the openings to drive the cooling air to flow upwards through the openings.

6. The heat dissipation system of claim 4, wherein the controlling module comprises a computing unit and a driving unit electrically connected to the computing unit, the computing unit is electrically connected to the plurality of temperature sensors to receive the temperatures sensed by the temperature sensors, and compare the temperatures with one another, the computing unit sends a controlling signal to the driving unit to adjust the speeds of the pressurizing fans in response to the temperatures being different from one another, therefore the temperatures tend to be equal.

7. The heat dissipation system of claim 4, wherein the controlling module comprises a computing unit, a driving unit electrically connected to the computing unit, and an input unit electrically connected to the computing unit, a temperature range is inputted into the input unit, the computing unit is electrically connected to the plurality of temperature sensors to receive the temperatures sensed by the temperature sensors, and compare the temperatures with temperature range, the computing unit sends a controlling signal to the driving unit to adjust the speeds of the pressurizing fans in response to the temperatures being out of the temperature range, thereby making the temperatures be within the temperature range.

* * * * *